United States Patent
Yamazoe et al.

(10) Patent No.: US 7,212,441 B2
(45) Date of Patent: May 1, 2007

(54) NON VOLATILE SEMICONDUCTOR MEMORY DEVICE

(75) Inventors: Takanori Yamazoe, Kokubunji (JP); Shin Ito, Yuwa (JP); Yoshiki Kawajiri, Amagasaki (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/272,832

(22) Filed: Nov. 15, 2005

(65) Prior Publication Data

US 2006/0140003 A1  Jun. 29, 2006

(30) Foreign Application Priority Data

Dec. 28, 2004  (JP) ............................. 2004-379293

(51) Int. Cl.
*G11C 11/34* (2006.01)
(52) U.S. Cl. ................................. 365/185.11; 365/233
(58) Field of Classification Search ........... 365/185.11, 365/233
See application file for complete search history.

(56) References Cited

U.S. PATENT DOCUMENTS

| | | | | |
|---|---|---|---|---|
| 5,818,766 | A * | 10/1998 | Song ..................... | 365/189.11 |
| 6,147,525 | A * | 11/2000 | Mitani et al. ............. | 327/119 |
| 2006/0006925 | A1* | 1/2006 | Yamazoe et al. ........... | 327/536 |

FOREIGN PATENT DOCUMENTS

| JP | 61-077197 | 9/1984 |
|---|---|---|
| JP | 2005-267734 | 3/2004 |

OTHER PUBLICATIONS

Toru Tanzawa et al., "A Dynamic Analysis of the Dickson Charge Pump Circuit", IEEE Journal of Solid-State Circuits, vol. 32, No. 8, Aug. 1997, pp. 1231-1240.

* cited by examiner

*Primary Examiner*—Michael Tran
(74) *Attorney, Agent, or Firm*—Reed Smith LLP; Stanley P. Fisher, Esq.; Juan Carlos A. Marquez, Esq.

(57) ABSTRACT

In a nonvolatile semiconductor memory device, the increase of the capacity of a nonvolatile semiconductor memory inevitably causes the power supply circuits including the charge pump circuits at the periphery to increase. In view of the above situation, the object of the present invention is to provide a technology of allowing a nonvolatile semiconductor memory to increase the capacity without increasing the power supply circuits which are the peripheral circuits of the nonvolatile semiconductor memory. It is possible to carry out the erase and write of plural memory cell blocks by selecting memory cell blocks one by one in a power supply circuit containing a charge pump circuit having the capability of carrying out the erase and write of a memory cell block and it is also possible, at the time of read and standby, to increase the charge pump capability and select plural memory cell blocks by inputting clock signals having a frequency not less than the frequency of the clock signals at the time of the operations of erase and write to charge pumps.

10 Claims, 15 Drawing Sheets

| Mode | Vpp | CLKOUT | SELECTION MEMORY BLOCK | Vpp LOAD CAPACITANCE |
|---|---|---|---|---|
| ERASE | -8.5V | 6MHz | ONE OF MEMORY BLOCK 1,2,3 AND 4 | 1000pF |
| WRITE | -10.5V | 6MHz | ONE OF MEMORY BLOCK 1,2,3 AND 4 | 1000pF |
| READ | -2V | MORE THAN 6MHz | ALL OF MEMORY BLOCK 1,2,3 AND 4 | 2400pF |
| STANDBY | -1.5V | 0.5MHz | ALL OF MEMORY BLOCK 1,2,3 AND 4 | 2400pF |

NON VOLATILE SEMICONDUCTOR MEMORY DEVICE

CLAIM OF PRIORITY

The present application claims priority from Japanese application JP 2004-379293 filed on Dec. 28, 2004, the content of which is hereby incorporated by reference into this application.

FIELD OF THE INVENTION

The present invention relates to a nonvolatile semiconductor memory device, in particular to a technology of allowing a nonvolatile semiconductor memory to increase the capacity without increasing the power supply circuits which are the peripheral circuits of the nonvolatile semiconductor memory.

BACKGROUND OF THE INVENTION

In recent years, a nonvolatile semiconductor memory device equipped with a nonvolatile semiconductor memory has been required to be equipped with a large-capacity nonvolatile semiconductor memory with the increase of the variety of applications and the like.

One of the factors hindering the increase of the capacity of a nonvolatile semiconductor memory is the increase of the chip cost caused by the increase of the area of a chip. In this light, proposed are: a Single MONOS (Metal Oxide Nitride Oxide Semiconductor) memory having the configuration of one transistor to one bit as described in JP-A No. 77197/1986 in order to reduce a chip area; and also a charge pump circuit to generate high voltage corresponding to the Single MONOS (hereunder referred to as "S-MONOS).

FIGS. 1A to 1D are diagrams showing operation biases in the various modes of an S-MONOS. As shown in FIG. 1A, at the time of erase, the threshold value (Vth) of a memory cell is set to the negative side by: applying −8.5 V to a memory gate (MG) and 1.5 V which is the power supply voltage to a well, a source (S), and a drain (D); and extracting electrons in a nitride film to the side of the well by the tunnel effect. As shown in FIG. 1B, at the time of write, the threshold value (Vth) of a memory cell is set to the positive side by: applying 1.5 V to an MG and −10.5 V to a well, a source (S), and a drain (D); and injecting electrons into a nitride film by the tunnel effect. As shown in FIG. 1C, at the time of read, by applying 0 V to a selected MG, 0 V to a source, and precharged 1.0 V to a drain: if a memory cell is in the state of erase, since Vth is negative, electric current flows between the drain and the source and thus it is detected that the drain potential lowers; and, if the memory cell is in the state of write, since Vth is positive, electric current does not flow between the drain and the source and thus it is detected that the drain potential is kept at 1 V. Further, as shown in FIG. 1D, at the time of standby, −1.5 V, which is not more than the Vth of a memory cell at the time of erase, is applied to an MG and a well.

Then, FIG. 2A shows a schematic diagram of charge pump circuits corresponding to the S-MONOS and FIG. 2B shows the charge pump circuit of each stage. In FIG. 2A, the signals CONTIN, CONTOUT, ACLK, and BCLK shown in FIG. 2B are not written for simplification. As it is obvious from the operation biases sown in FIG. 1, the feature of the configuration is that, in the charge pump circuit configuration shown in FIG. 2A, a switch is introduced between adjacent two stages of the charge pumps so as to be able to change the number of the stages of the charge pumps since the charge pump output voltage varies for each of erase/write, read, and standby.

SUMMARY OF THE INVENTION

However, the increase of the capacity of a nonvolatile semiconductor memory inevitably causes the power supply circuits including the charge pump circuits at the periphery to increase as shown in FIG. 3.

In view of the above situation, the object of the present invention is to provide a technology of allowing a nonvolatile semiconductor memory to increase the capacity without increasing the power supply circuits which are the peripheral circuits of the nonvolatile semiconductor memory.

The features of the present invention will be clarified through the description and attached drawings in this specification.

The representative gist of the invention disclosed in the present application is briefly explained below.

The present invention is a nonvolatile semiconductor memory device characterized by: being a nonvolatile semiconductor memory comprising a plural number (n) of memory cell blocks; at the time of erase or write, supplying high voltage necessary for the erase or write to one to (n−1) memory cell brocks selected from among the plural number (n) of memory cell blocks; and, at the time of read or standby, supplying high voltage necessary for the read or standby to all the memory cell blocks.

Thereby, at the time of erase or write, it is not necessary to supply high voltage to all the memory cell blocks and, at the time of read and standby, it is possible to maintain the linearity (carry out read without weighting memory cell brocks astride them) of the read by supplying high voltage to all the memory cell blocks.

The effects obtained from the representative gist of the invention disclosed in the present application are briefly explained below.

It is possible to carry out the erase and write of plural memory cell blocks by selecting memory cell blocks one by one in a power supply circuit containing a charge pump circuit having the capability of carrying out the erase and write of a memory cell block and, at the time of read and standby, it is possible to increase the charge pump capability and select plural memory cell blocks by inputting clock (CLK) signals having a frequency not less than the frequency of the clock signals at the time of the operations of erase and write to charge pumps.

Thereby, even though the number of the memory cell blocks is two or more, only one power supply circuit capable of the erase and write of a memory cell block is required as the power supply circuit containing a charge pump circuit and the area of the chip can considerably be reduced.

DETAILED DESCRIPTION OF THE PREFERRED EMBODIMENT

The examples of the present invention are hereunder explained in detail on the basis of the drawings. Here, in all the drawings for the explanations of the examples, the same symbol is used for the same member in order to avoid the repetition of the explanations.

First Embodiment

Figure 1A:
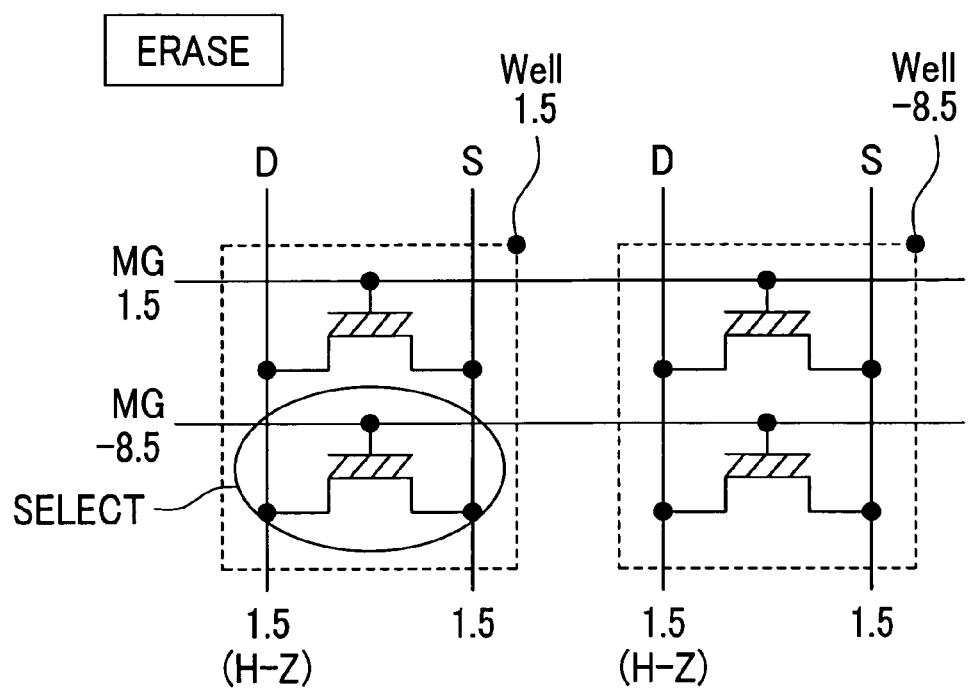
FIG. 1A is a diagram showing operation bias in the erase mode of an S-MONOS type EEPROM.
Figure 1B:
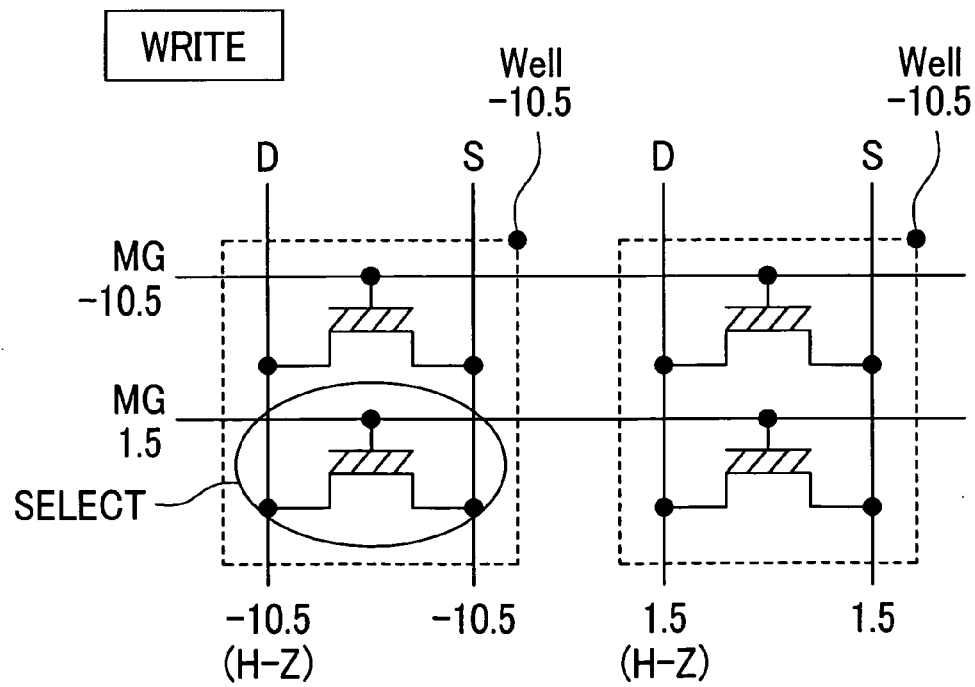
FIG. 1B is a diagram showing operation bias in the write mode of the S-MONOS type EEPROM.
Figure 1C:
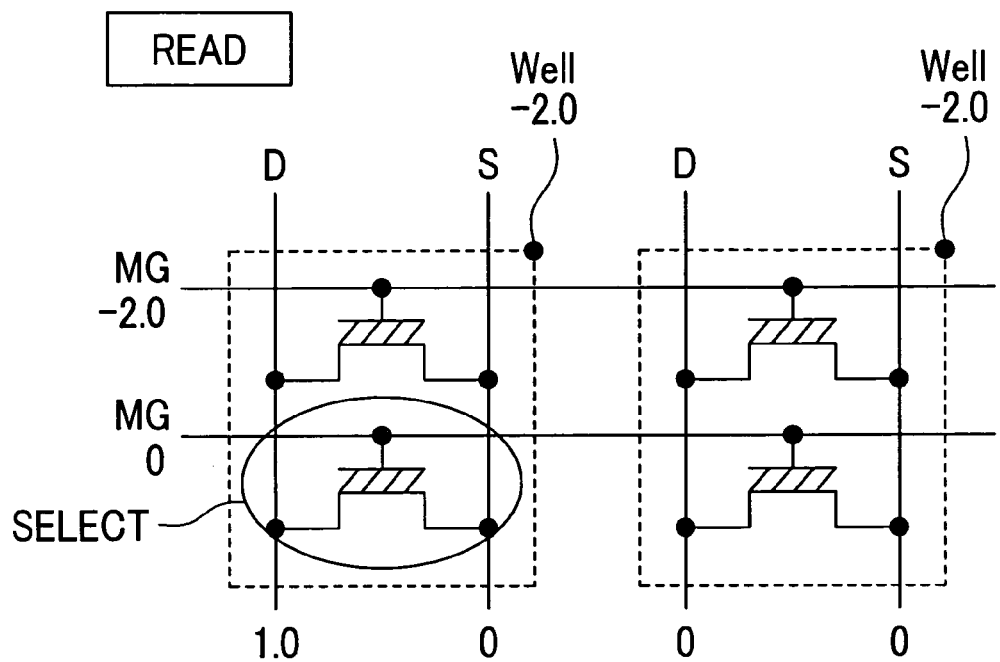
FIG. 1C is a diagram showing operation bias in the read mode of the S-MONOS type EEPROM.
Figure 1D:
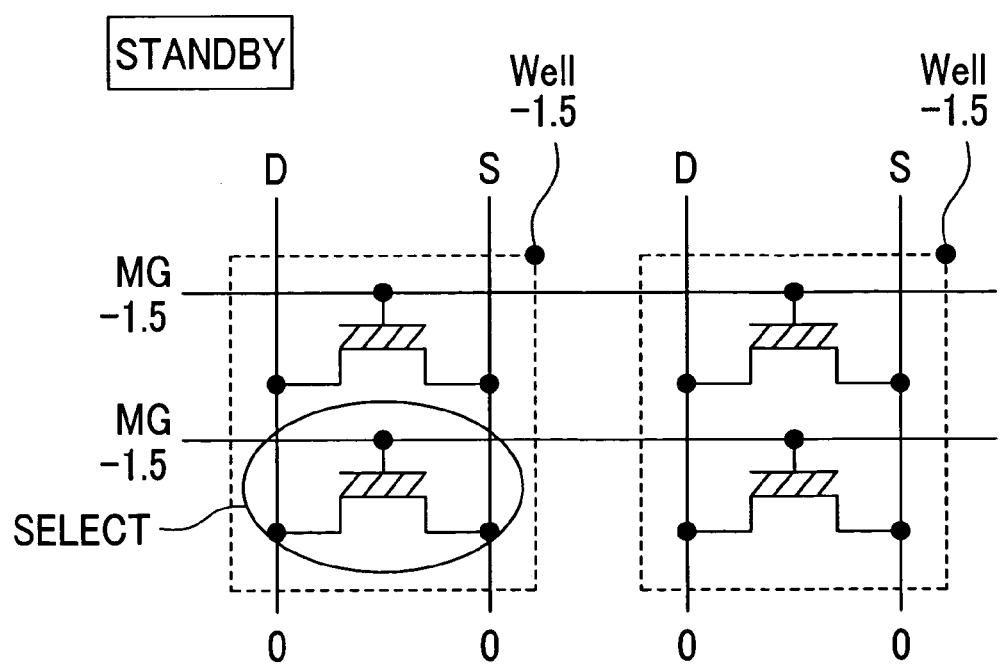
FIG. 1D is a diagram showing operation bias in the standby mode of the S-MONOS type EEPROM.
Figure 2A:
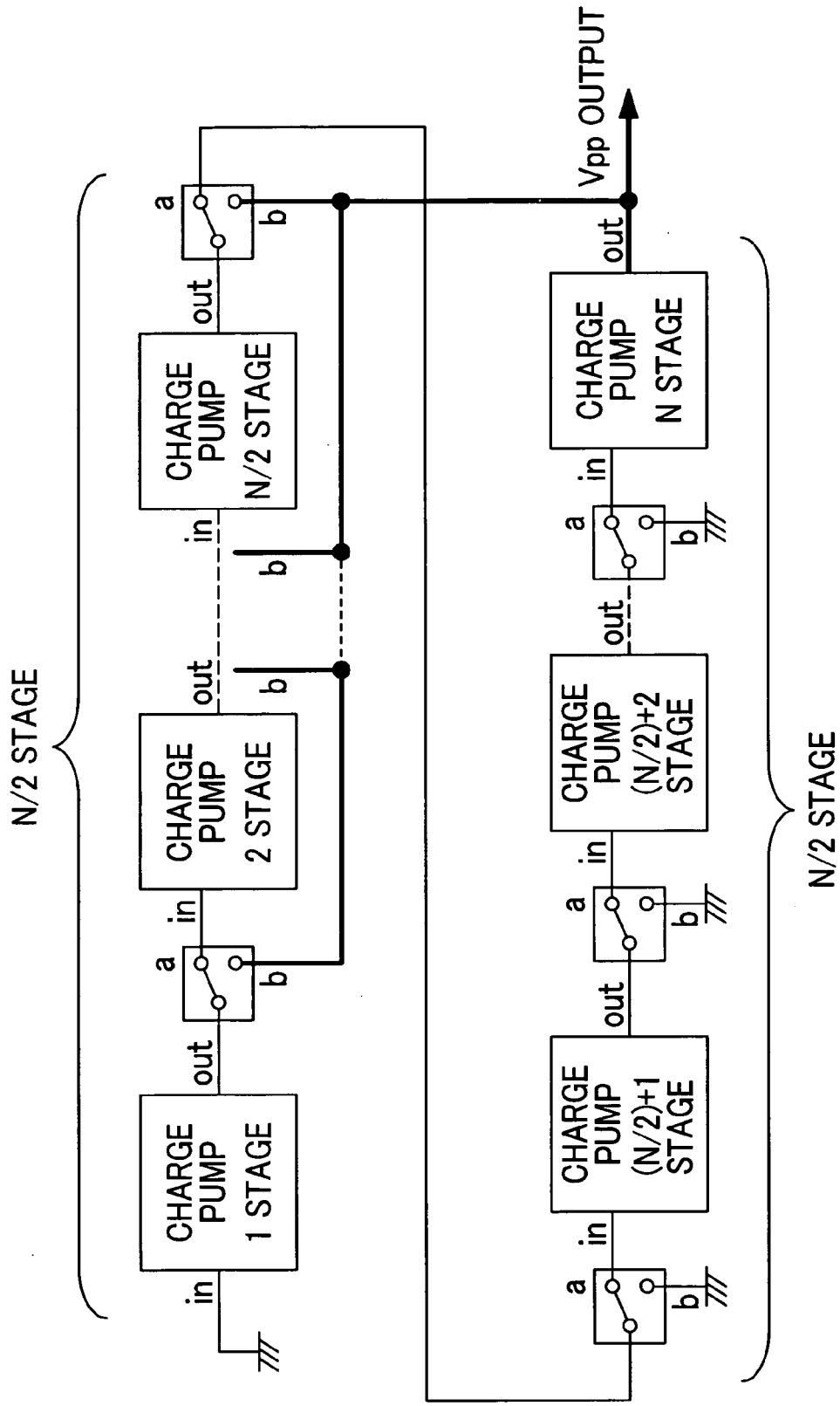
FIG. 2A is a schematic diagram showing the configuration of charge pumps to supply high voltage to an S-MONOS type EEPROM.
Figure 2B:
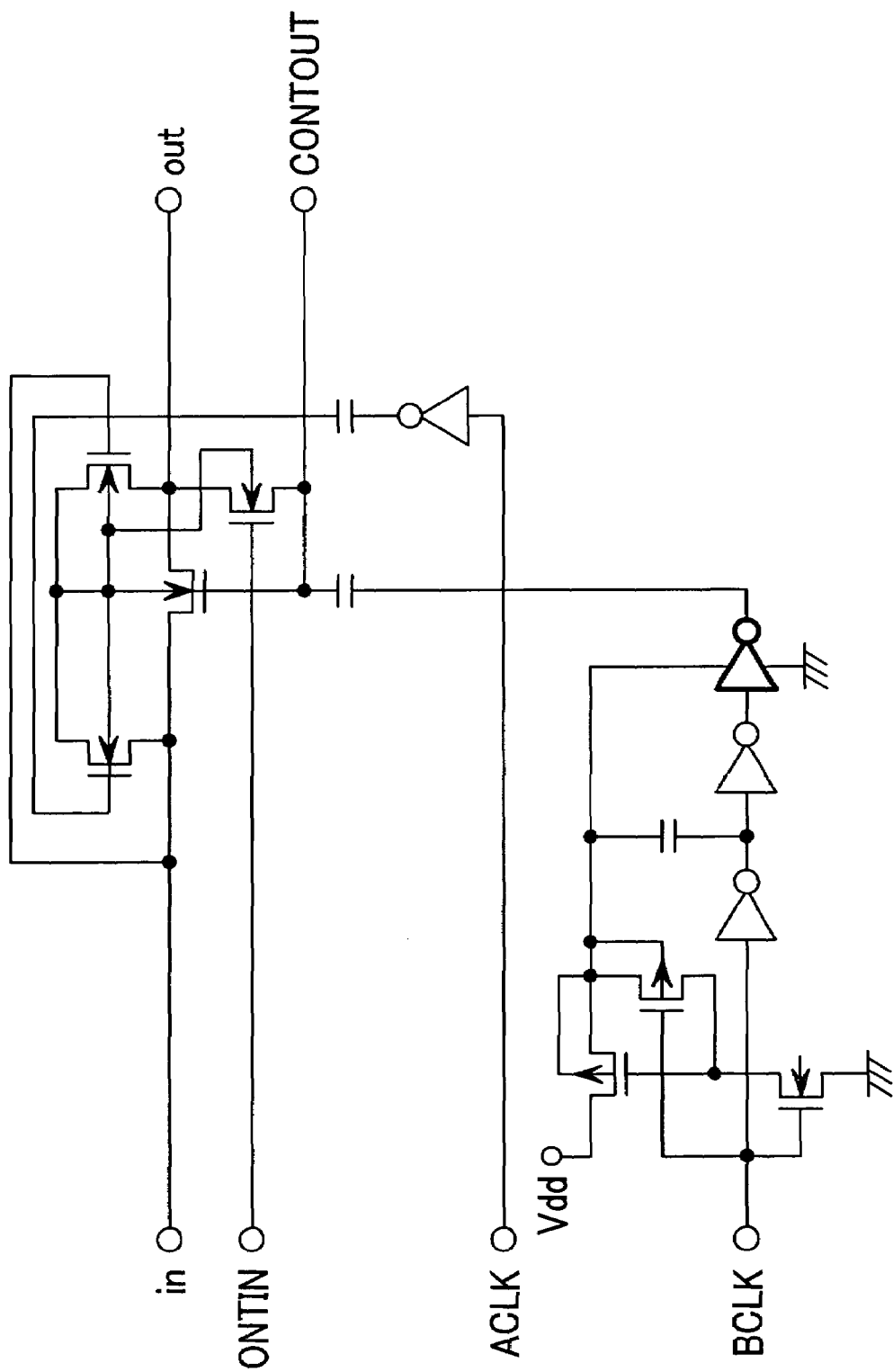
FIG. 2B is the circuit diagram of a charge pump at an arbitrary stage to supply high voltage to the S-MONOS type EEPROM.
Figure 3:
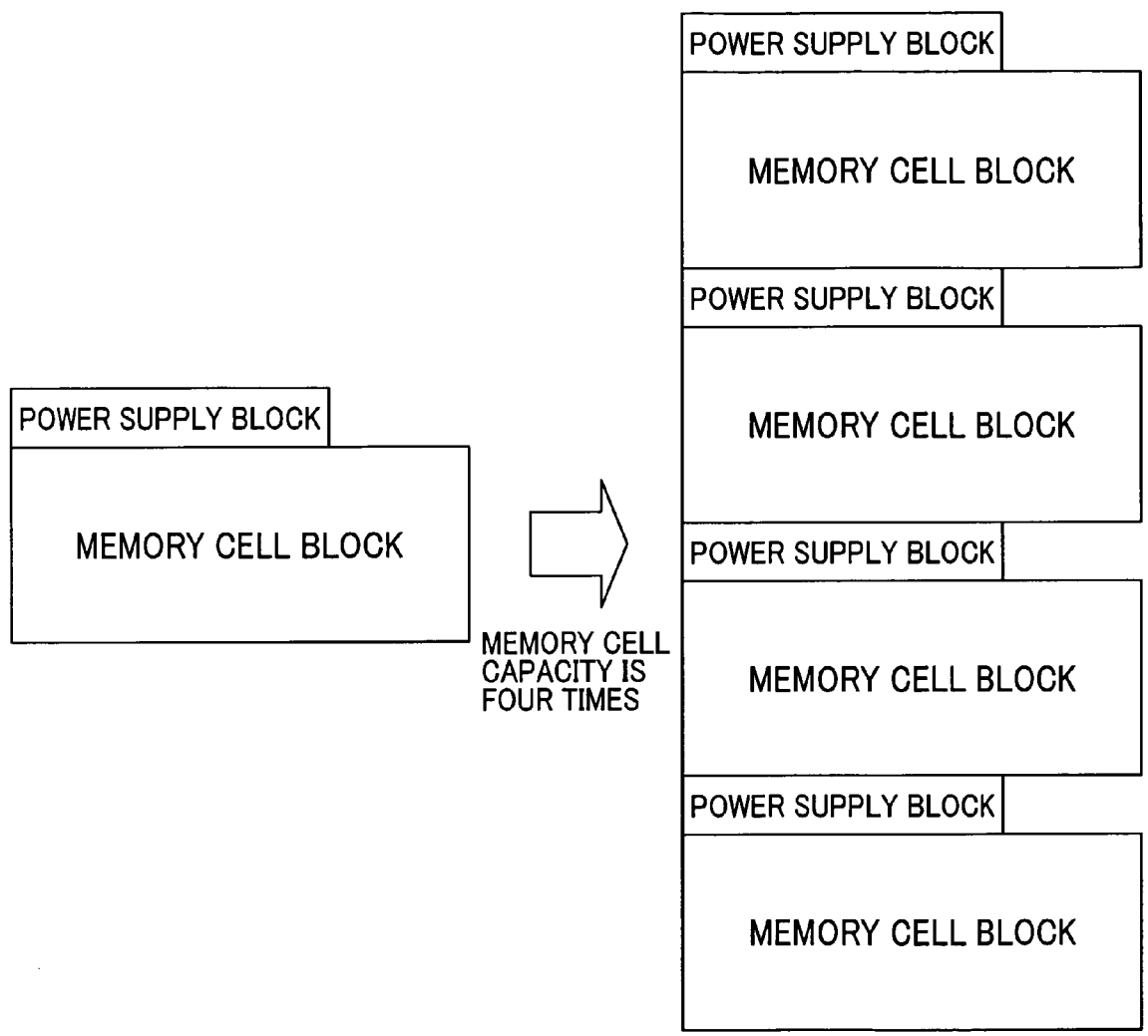
FIG. 3 is an illustration showing that the power supply circuits also increase in accordance with the increase of a memory capacity.
Figure 4:
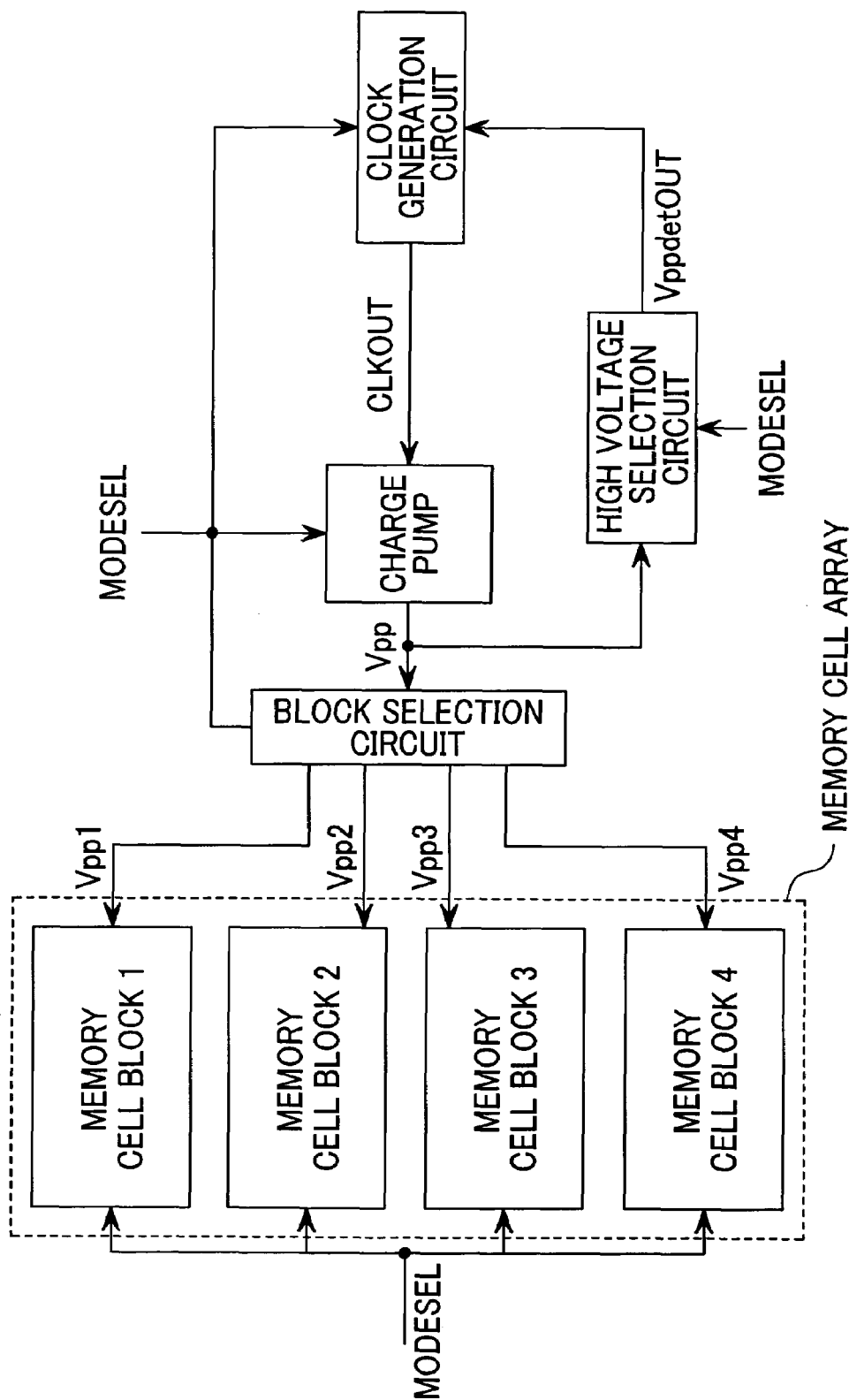
FIG. 4 is a block diagram showing the configuration of a nonvolatile semiconductor memory according to the present invention.

An example of the configuration of the present invention is shown in FIG. 4. The configuration of the present invention includes: a memory cell array comprising plural memory cell blocks; a block selection circuit to select one or more memory cell blocks; a charge pump circuit to generate high voltage (Vpp); a clock generation circuit to supply clock (CLK) to the charge pump circuit; and a high voltage selection circuit to detect Vpp output from the charge pump circuit in accordance with a mode.

Here, a memory cell block requires, besides power supply voltage, positive or negative high voltage at least at the time of erase, write, and read and the absolute value of the high voltage at the time of the read must be lower than the absolute value of the high voltage at the time of the erase and write.

The charge pump circuit has the capability of supplying Vpp only to one memory cell block at the time of erase or write. Therefore, the block selection circuit selects one memory cell block out of the four memory cell blocks at the time of the erase or write and thereby the charge pump circuit supplies Vpp.

It sometimes happens that plural memory cell blocks are used for read at the time of the read and also, at the time of standby, there is the possibility that read is carried out immediately after the release of the standby. Hence, if Vpp is supplied to only one memory cell block, when plural memory cell blocks are used for read, the delay time caused by the block selection switching time and additional recharging time for the supply of Vpp to the memory cell blocks are required and thus the charge pump circuit cannot be used for ordinary read operation.

To cope with the problem, in the present invention, the block selection circuit selects all the four memory cell blocks and supplies Vpp to all the memory cell blocks at the time of read and standby.

Figure 5:
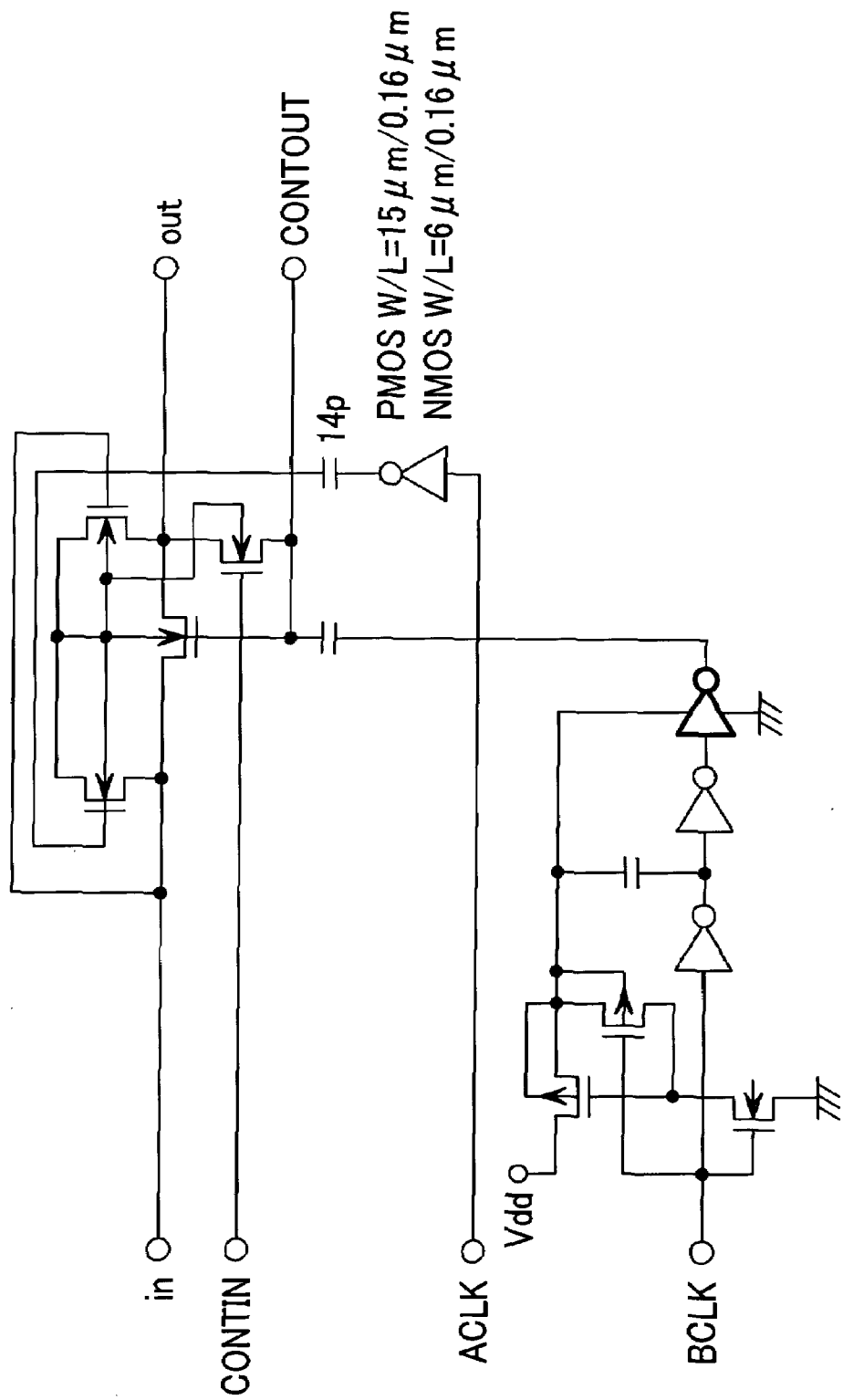
FIG. 5 is the circuit diagram of a charge pump at an arbitrary stage according to the present invention.
Figure 6:
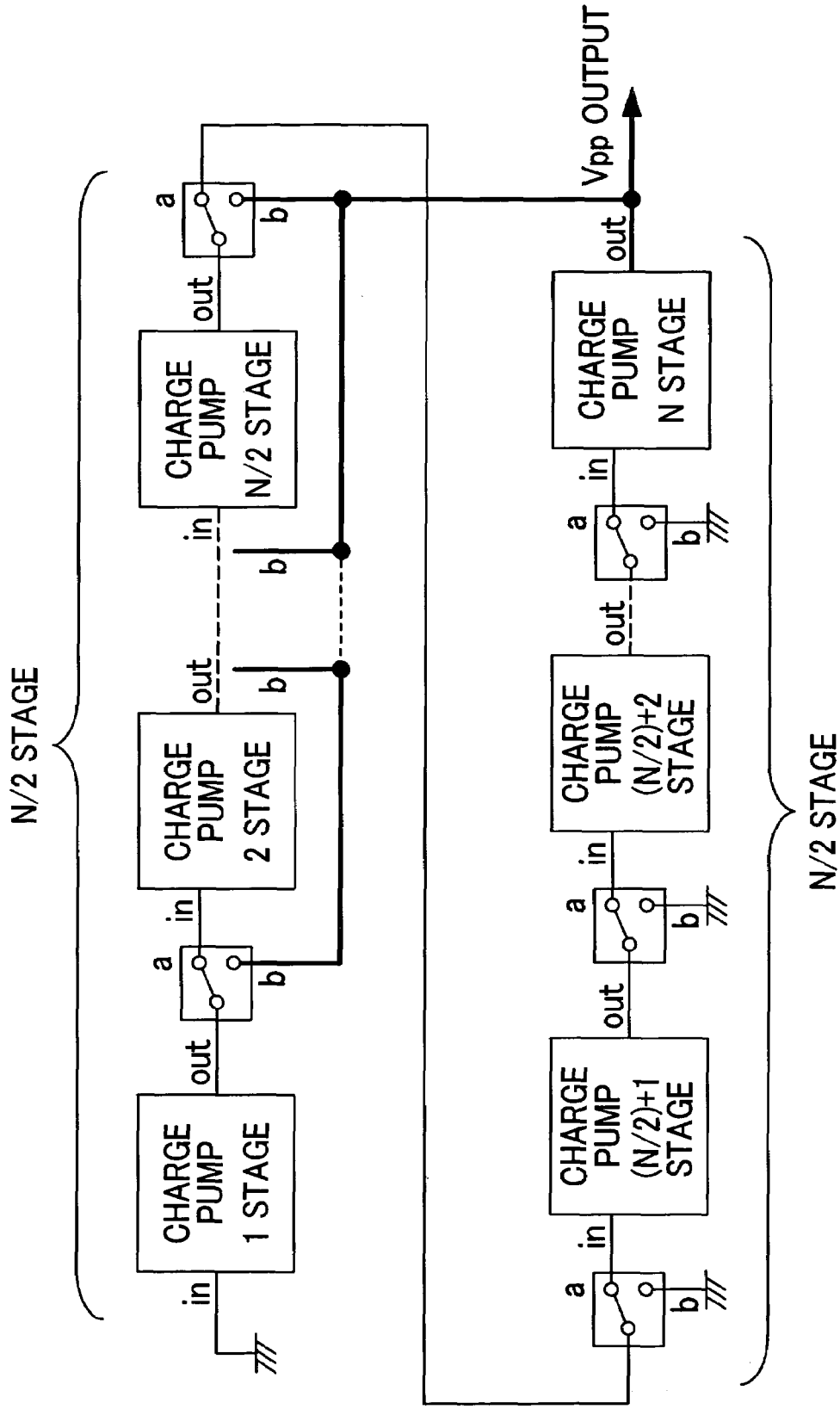
FIG. 6 is a schematic diagram showing the configuration of charge pumps according to the present invention.

Next, the charge pump circuit is configured so that charge pumps, an arbitrary one of which is shown in FIG. 5, are connected at plural stages as shown in FIG. 6 and generates Vpp corresponding to a mode by operating the switches disposed between adjacent charge pump stages in accordance with the mode. For example, at the time of erase or write, all the switches between adjacent charge pump stages are connected to a terminals, all of the N charge pump stages are connected in series, and thus the charge pump circuit generates Vpp of −8.5 or −10.5 V.

At the time of read, anteroposterior N/2 or less stages are connected in parallel and the charge pump circuit generates Vpp of −2 V which is lower than the voltage at the time of erase or write but has the capability of supplying more electric current. For example, when anteroposterior five stages are connected in parallel, the output switches of the five charge pump stages are connected to b terminals and the input switches of (N−4) stages are connected to b terminals. The other switches are connected to a terminals.

At the time of standby, for example only four stages are activated, the input switches of (N−3) stages are connected to b terminals, and the other switches are connected to a terminals.

The high voltage selection circuit detects Vpp of −8.5 V or lower at the time of erase and outputs the detection signal VppdetOUT to the clock generation circuit. For example, it outputs logic "H." The clock generation circuit which has received the VppdetOUT signal stops the supply of clock signal to the charge pump circuit. In the charge pump circuit, when the clock stops, Vpp rises and becomes −8.5 V or more. When Vpp is −8.5 V or more, the high voltage selection circuit outputs the VppdetOUT signal of logic "L" and the clock generation circuit outputs the clock signal. By repeating the above operations, Vpp of −8.5 V is maintained.

The operations are carried out so that Vpp is −10.5 V at the time of write, Vpp is −2 V at the time of read, and Vpp is −1.5 V at the time of standby.

The clock generation circuit generates, for example, the clock of 6 MHz at the time of erase and write, and the clock of 6 MHz and more in order to enhance the capability of supplying electric current at the time of read. At the time of standby, it generates the clock of 0.5 MHz in order to lower the current consumption.

Figures 7, 8A:
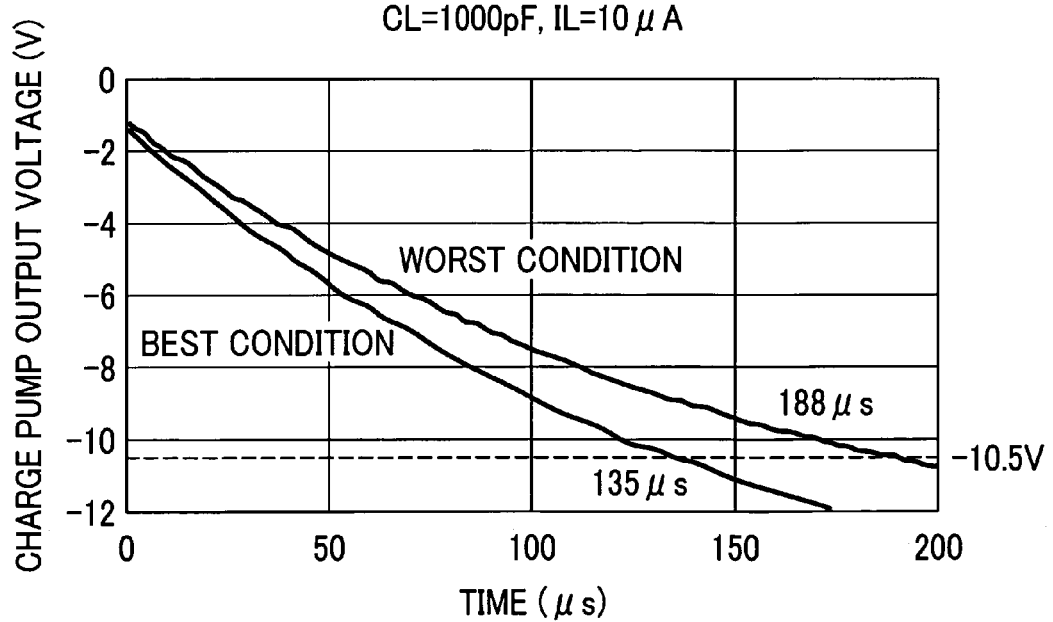
FIG. 7 is a table showing the operation conditions and specifications according to the present invention.
FIG. 8A is a graph showing a characteristic (charge pump output voltage) at the time of write in a charge pump circuit according to the present invention.

FIG. 7 shows the operations of the circuit blocks in each mode. In FIG. 7, it is assumed that each memory cell block is 64 k bytes and the Vpp load capacitance is 1,000 pF at the time of erase or write, and that the memory cell array is 256 k bytes and the Vpp load capacitance is 2,400 pF at the time of read and standby.

Figure 8B:
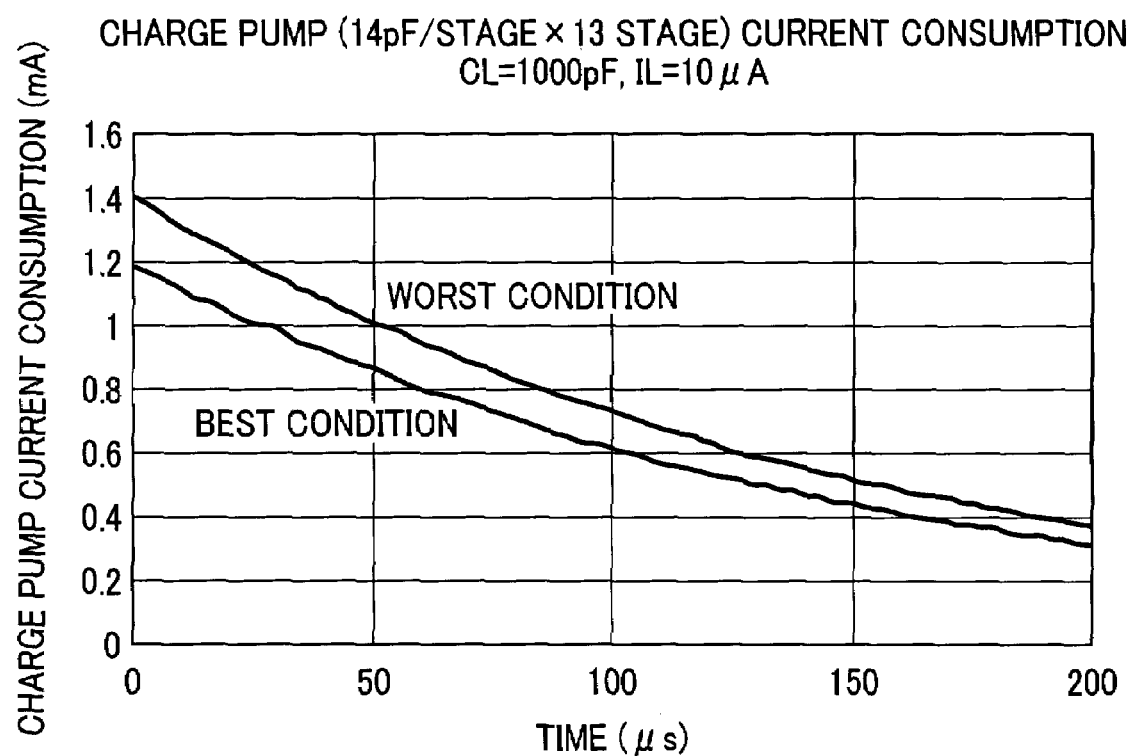
FIG. 8B is a graph showing a characteristic (charge pump current consumption) at the time of write in a charge pump circuit according to the present invention.
Figure 9A:
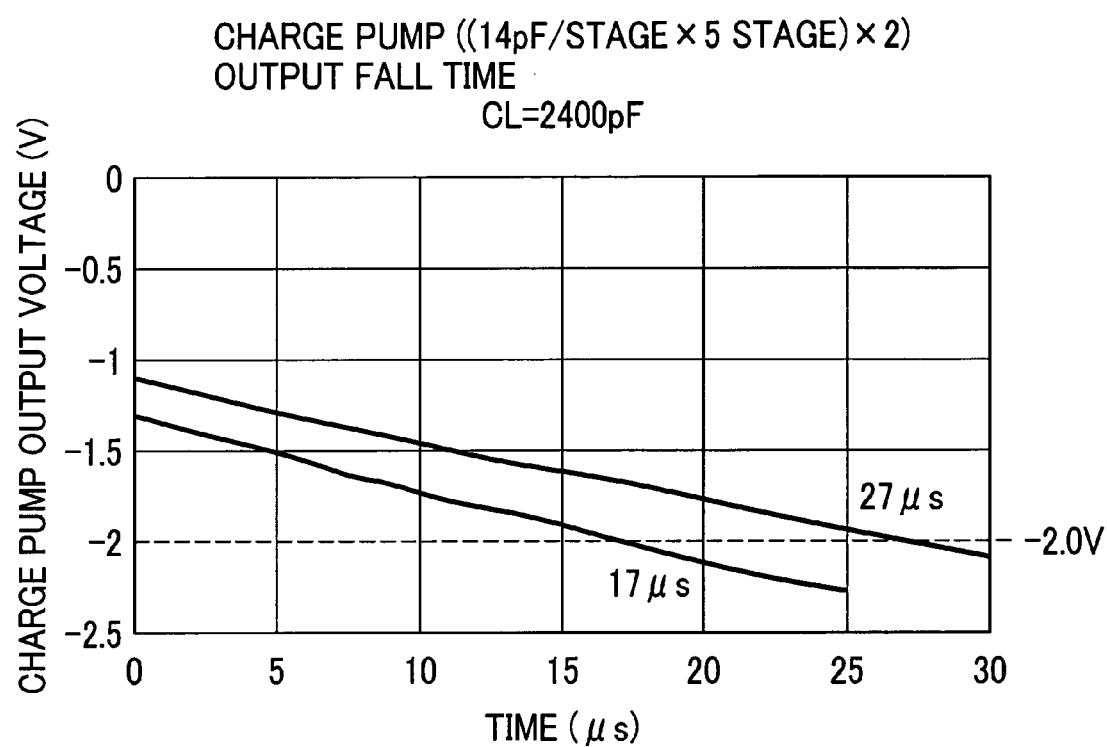
FIG. 9A is a graph showing a characteristic (charge pump output voltage) during the time from power-on to read in a charge pump circuit according to the present invention.
Figure 9B:
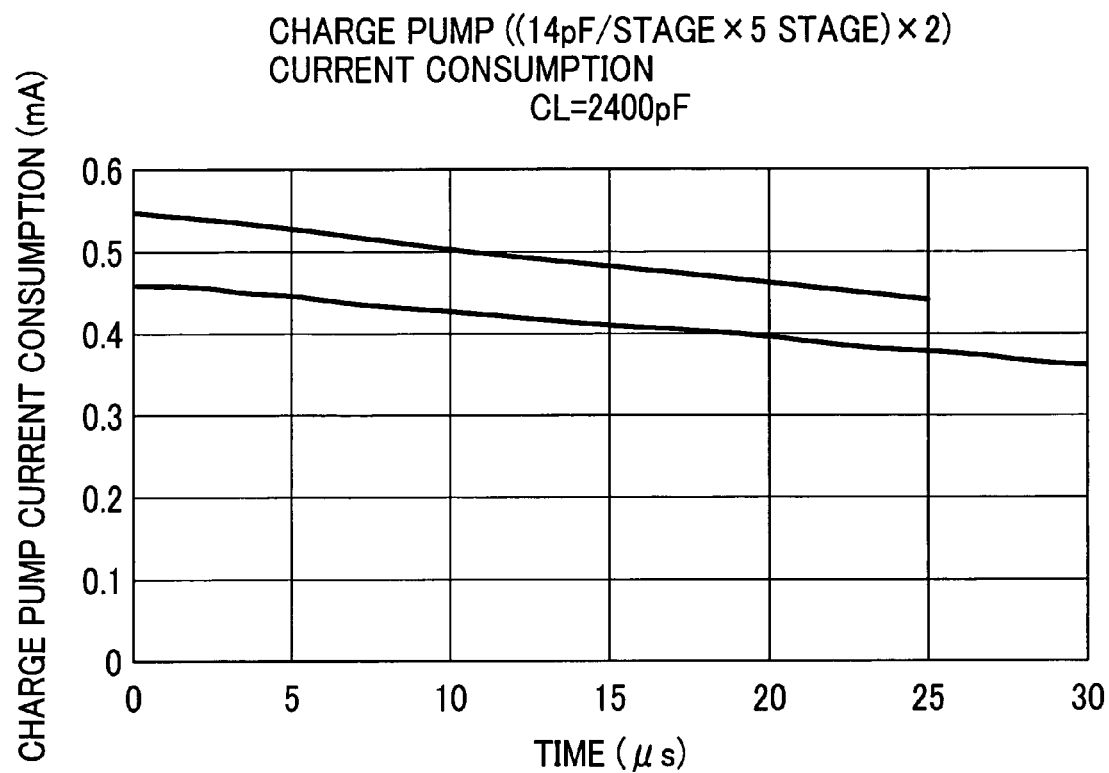
FIG. 9B is a graph showing a characteristic (charge pump current consumption) during the time from power-on to read in a charge pump circuit according to the present invention.
Figure 10A:
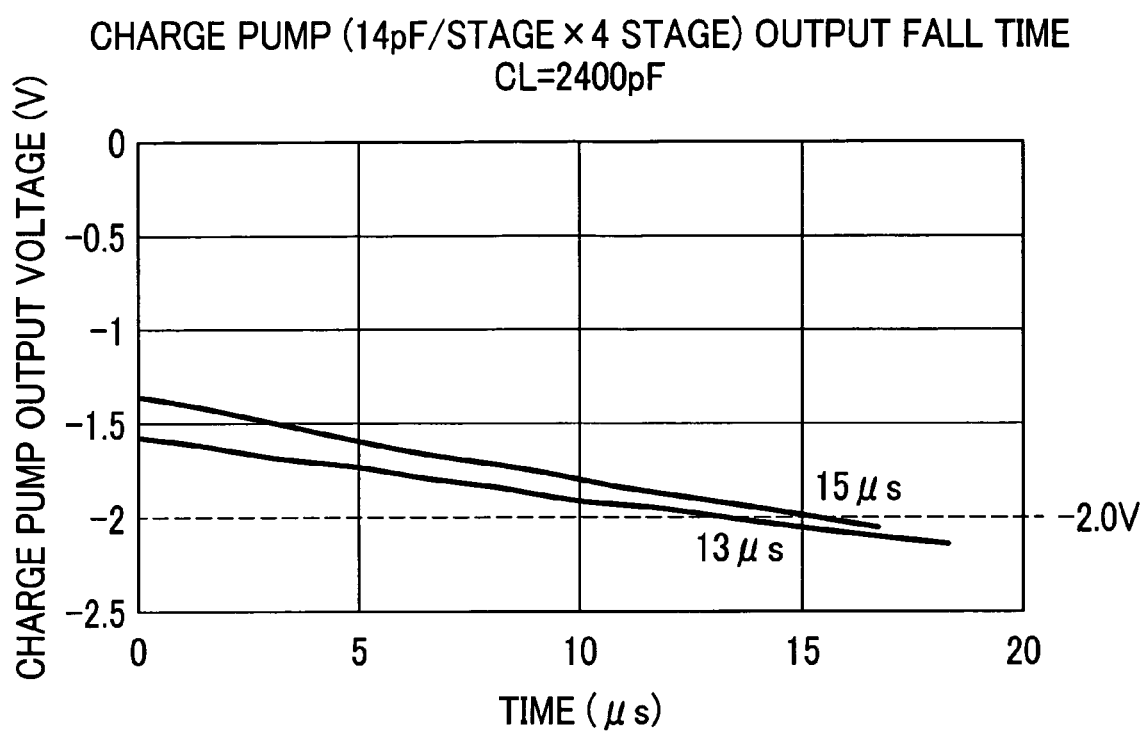
FIG. 10A is a graph showing a characteristic (charge pump output voltage) during the time from standby to read in a charge pump circuit according to the present invention.
Figure 10B:
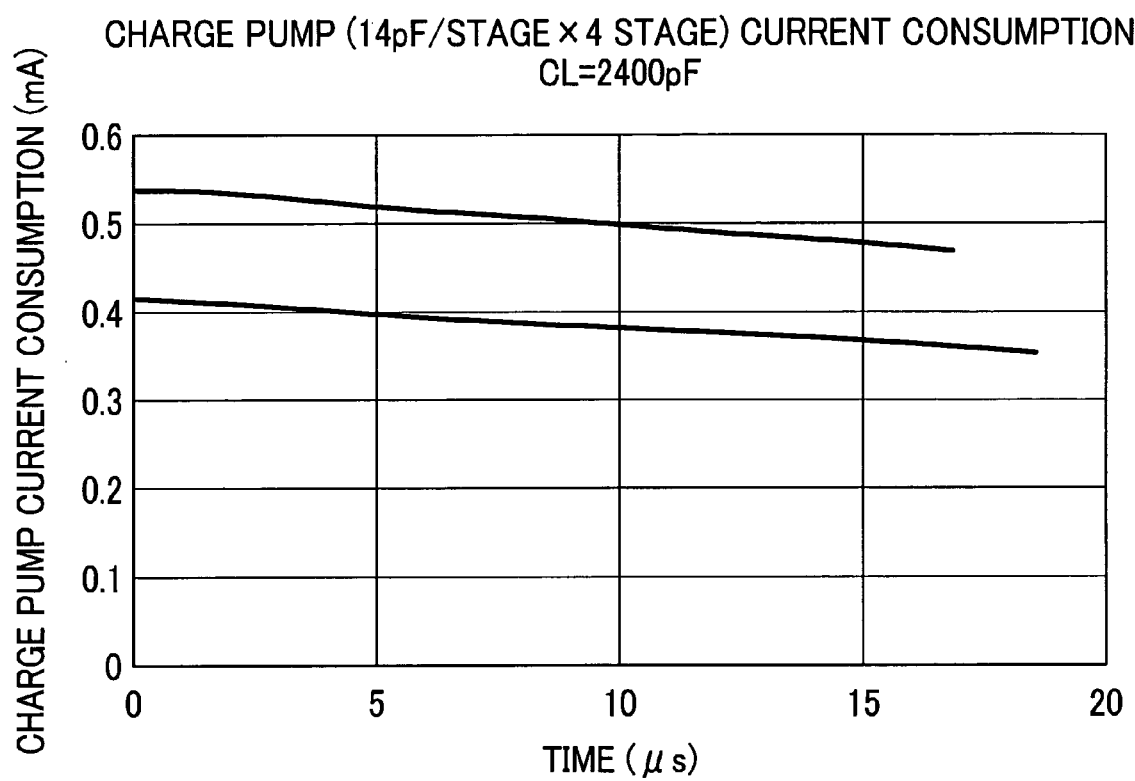
FIG. 10B is a graph showing a characteristic (charge pump current consumption) during the time from standby to read in a charge pump circuit according to the present invention.

FIGS. 8 to 10 show the results of the desk calculation of Vpp output fall time and current consumption on the basis of the document "A Dynamic Analysis of the Dickson Charge Pump Circuit," IEEE Journal of Solid-State Circuits, August 1997, Vol. 32, No. 8.

The charge pump circuit used here comprises charge pumps of 13 stages each of which has the capacitance of 14 pF, and the 13 stages operate in series at the time of erase and write, the aforementioned anteroposterior five stages operate in parallel at the time of read, and the aforementioned three stages operate at the time of standby.

FIG. 8 shows the output fall time and current consumption until Vpp voltage −10.5 V which is applied to one memory cell block of 64 K bytes is attained at the time of write. It is necessary that the output fall time is not less than 100 μs from the requirement of the memory cell and not more than 200 μs from the requirement of the system and that the current consumption is 1.5 mA or less from the requirement of the system. As the results of the desk calculation, the output fall time was in the range from 135 to 188 μs and the current consumption was in the range from 1.2 to 1.4 mA, and thus it was clarified that the required specifications were satisfied.

FIG. 9 shows the output fall time and current consumption until Vpp voltage −2 V which is applied to four memory cell blocks of 256 K bytes is attained during the time from power-on to read. It is necessary that the output fall time is several tens of microseconds or less and the current consumption is 1 mA or less from the requirement of the system. As the results of the desk calculation, the output fall time was in the range from 17 to 27 μs and the current consumption was in the range from 0.46 to 0.55 mA, and thus it was clarified that the required specifications were satisfied.

FIG. 10 shows the output fall time and current consumption until Vpp voltage −2 V which is applied to four memory cell blocks of 256 K bytes is attained during the time from standby to read. It is necessary that the output fall time is several tens of microseconds or less and the current consumption is 1 mA or less from the requirement of the system. As the results of the desk calculation, the output fall time was in the range from 13 to 15 μs and the current consumption was in the range from 0.42 to 0.54 mA, and thus it was clarified that the required specifications were satisfied.

Second Embodiment

Figure 11:
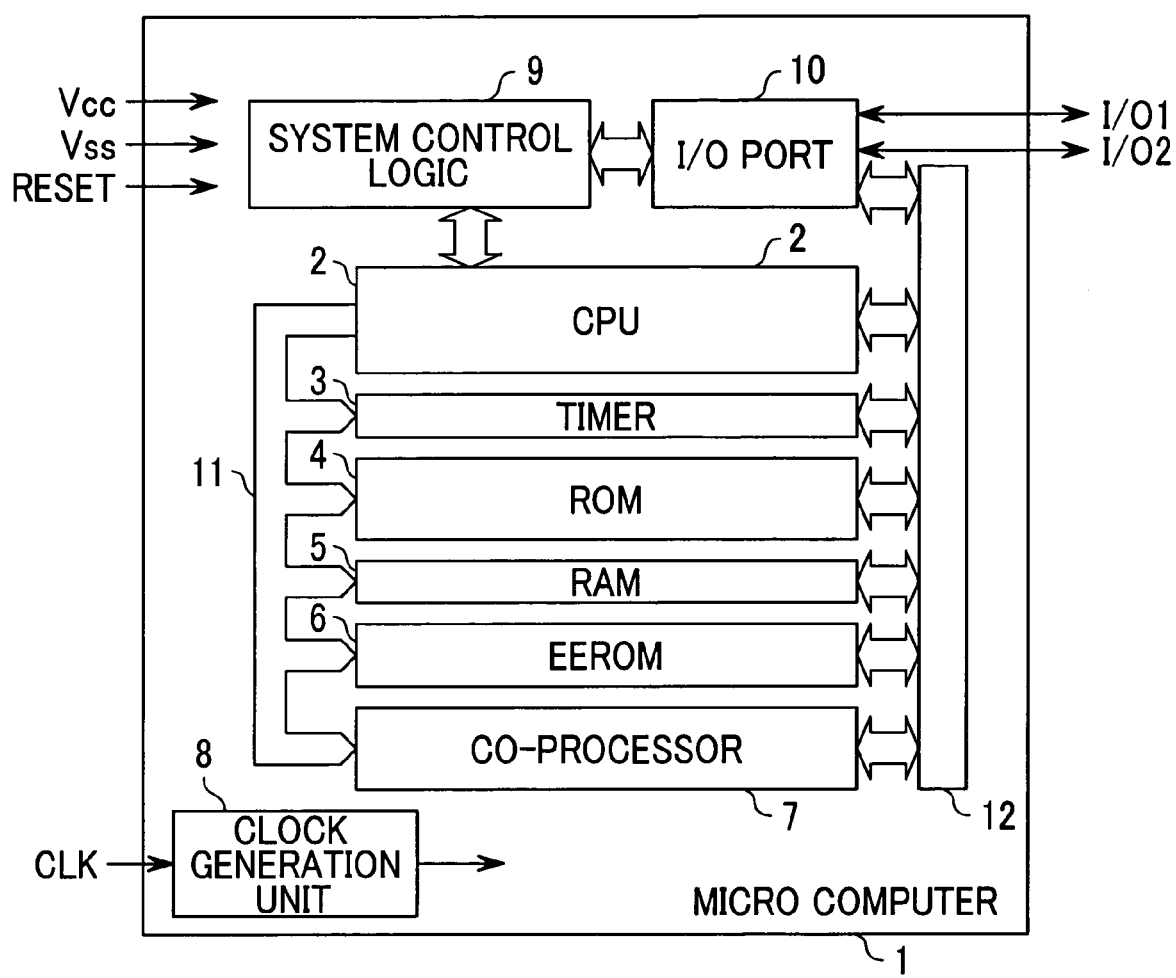
FIG. 11 is a diagram showing an example of a semiconductor integrated circuit device wherein an EEPROM according to the present invention is used.

FIG. 11 shows a microcomputer that is one example of a semiconductor integrated circuit device wherein a large-capacity EEPROM described in the first embodiment is used. The microcomputer 1 comprises: a memory group comprising a CPU (Central Processing Unit) 2, an ROM (Read Only Memory) 4, an SRAM (Static Random Access Memory) 5, and an EEPROM (Electrically Erasable Programmable Read Only Memory) 6; an I/O port 10 acting as an interface with the exterior; a clock generation circuit 8 to supply clock to the CPU 2 and other circuits; a timer 3 to control the time of a system timer or a memory circuit; a system control logic 9; a co-processor 7; an address bus 11; a data bus 12; and others.

In general, boot program software for the start of the CPU 2 is contained in the ROM 4, various kinds of data which are frequently rewritten and application software are stored in the EEPROM 6, and thus rewrite at each byte can be carried out. When an IC card chip for a cellular phone is taken as an example, the data such as telephone numbers, billing information, telephone messages, and others are stored in an EEPROM 6.

In recent years, a nonvolatile memory including a large-capacity EEPROM has been required owing to: the trends of multi-application caused by the higher functionality of an IC card and the like; and the increase of various kinds of data accompanying the increase of the multi-application. By using an EEPROM shown in the first embodiment in a semiconductor integrated circuit device including an IC card and the like, it becomes possible to configure the semiconductor integrated circuit device of a small area and low power consumption.

What is claimed is:

1. A nonvolatile semiconductor memory device comprising:
   a memory cell array comprising plural nonvolatile memory cell blocks;
   a boosting circuit to supply a prescribed high voltage to said nonvolatile memory cell blocks;
   a clock generation circuit to supply clock signals to said boosting circuit;
   a high voltage selection circuit to detect the voltage output from said boosting circuit for each input of said clock signals and to output the signal of stopping supplying said clock signals to said clock generation circuit after said prescribed high voltage is attained; and
   a block selection circuit to supply said prescribed high voltage to at least one of said nonvolatile memory cell blocks.

2. A nonvolatile semiconductor memory device according to claim 1, wherein said block selection circuit has the function of selecting nonvolatile memory cell blocks to which said prescribed high voltage is to be applied in accordance with the operation state of said memory cell array.

3. A nonvolatile semiconductor memory device according to claim 1, wherein said boosting circuit:
   comprises a charge pump circuit configured by connecting basic pump cells of plural stages; and
   outputs a prescribed high voltage by changing the number of the stages of said basic pump cells and further changing the electric current driving capability of said basic pump cells in accordance with the operation state of said memory cell array.

4. A nonvolatile semiconductor memory device according to claim 1, wherein said clock generation circuit changes the frequency of the signal generated by said clock generation circuit in accordance with the operation state of said memory cell array.

5. A nonvolatile semiconductor memory device according to claim 1, wherein said high voltage selection circuit changes the reference voltage to detect said prescribed high voltage in accordance with the operation state of said memory cell array.

6. A nonvolatile semiconductor memory device:
   being equipped with nonvolatile memory cell blocks configured by arraying nonvolatile memory cells having an erase mode, a write mode, a read mode, and a standby mode, and a memory cell array comprising said nonvolatile memory cell blocks; and
   having a high voltage supply means of supplying high voltage determined in accordance with each of said modes to said nonvolatile memory cell blocks, and a means of selecting nonvolatile memory cell blocks to which said prescribed high voltage is to be applied in accordance with each of said modes of said memory cell array, wherein said high voltage supply means comprises:
   a boosting means of generating said high voltage;

a clock generation means of supplying clock signals to said boosting means; and a high voltage selection means of repeating the output of said clock signals until said high voltage is attained by boosting operation in accordance with the input of said clock signal and stopping supplying said clock signals to said clock generation means after said prescribed high voltage is attained.

7. A nonvolatile semiconductor memory device according to claim 6, wherein the frequency of said clock signals supplied to said boosting means at the time of said read and standby is higher than the frequency of said clock signals at the time of said erase and write.

8. A nonvolatile semiconductor memory device according to claim 6, having the means of:

applying said high voltage to said selected memory cell blocks in said erase and write modes; and applying said high voltage to all the memory cell blocks composing said memory cell array in said read and standby modes.

9. A nonvolatile semiconductor memory device according to claim 6, wherein the means of selecting said memory cell blocks selects memory cell blocks to which said high voltage is to be applied in accordance with each of said modes.

10. An IC card having a nonvolatile semiconductor memory device comprising a memory cell array comprising plural nonvolatile memory cell blocks; a boosting circuit to supply a prescribed high voltage to said nonvolatile memory cell blocks; a clock generation circuit to supply clock signals to said boosting circuit; a high voltage selection circuit to detect the voltage output from said boosting circuit for each input of said clock signals and to output the signal of stopping supplying said clock signals to said clock generation circuit after said prescribed high voltage is attained; and a block selection circuit to supply said prescribed high voltage to at least one of said nonvolatile memory cell blocks.

* * * * *